United States Patent
Vaz et al.

(10) Patent No.: US 10,530,379 B1
(45) Date of Patent: Jan. 7, 2020

(54) CIRCUIT TO CALIBRATE CHOPPING SWITCH MISMATCH IN TIME INTERLEAVED ANALOG-TO-DIGITAL CONVERTER

(71) Applicant: Xilinx, Inc., San Jose, CA (US)

(72) Inventors: Bruno Miguel Vaz, Alcabideche (PT); Brendan Farley, Donabate (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/283,692

(22) Filed: Feb. 22, 2019

(51) Int. Cl.
| | |
|---|---|
| H03M 1/06 | (2006.01) |
| H03M 1/10 | (2006.01) |
| H03M 1/12 | (2006.01) |
| H03M 1/46 | (2006.01) |
| H03M 1/00 | (2006.01) |

(52) U.S. Cl.
CPC ....... H03M 1/1028 (2013.01); H03M 1/1215 (2013.01); H03M 1/46 (2013.01); H03M 1/00 (2013.01); H03M 1/06 (2013.01); H03M 1/10 (2013.01); H03M 1/12 (2013.01); H03M 1/1245 (2013.01)

(58) Field of Classification Search
CPC ........ H03M 1/06; H03M 1/10; H03M 1/1245; H03M 1/00; H03M 1/12
USPC ................. 341/118, 120, 123, 155, 141, 142
See application file for complete search history.

(56) References Cited

U.S. PATENT DOCUMENTS

| | | |
|---|---|---|
| 9,503,115 B1 | 11/2016 | Shin et al. |
| 9,584,144 B1 | 2/2017 | Zhou et al. |
| 9,584,145 B1 | 2/2017 | Shin et al. |
| 9,680,492 B1 | 6/2017 | Farley et al. |
| 10,291,247 B1* | 5/2019 | Verbruggen ........ H03M 1/1023 |

OTHER PUBLICATIONS

U.S. Appl. No. 15/912,318, filed Mar. 5, 2018, B. Vaz et al., Differential offset calibration of chopping switches in time-interleaved ADCs, San Jose, CA USA.

* cited by examiner

Primary Examiner — Joseph J Lauture
(74) Attorney, Agent, or Firm — William T. Paradice; Paradice & Li, LLP

(57) ABSTRACT

An analog-to-digital converter (ADC) circuit (400) and method of operation are disclosed. In some aspects, the ADC circuit (400) may include a plurality of channels (500), a gain calibration circuit (420), and a time-skew calibration circuit (430). Each of the plurality of channels (500) may include an ADC (520), a switch (510) configured to provide a differential input signal to the ADC (520), a calibration device (530), a multiplier (540), and a pseudorandom bit sequence (PRBS) circuit (550) to provide a pseudorandom number (PN) to the switch (510), to the calibration device (530), and to the multiplier (540). In some embodiments, the calibration device (530) may include first and second offset calibration circuits (531-532) coupled in parallel between a de-multiplexer (D1) and a multiplexer (M1) that alternately route signals to the first and second offset calibration circuits (531-532) based on the pseudorandom number (PN).

20 Claims, 6 Drawing Sheets

CIRCUIT TO CALIBRATE CHOPPING SWITCH MISMATCH IN TIME INTERLEAVED ANALOG-TO-DIGITAL CONVERTER

TECHNICAL FIELD

Aspects of the present disclosure generally relate to integrated circuits, and specifically to differential offset calibration of chopping switches in time-interleaved analog-to-digital converters (ADCs).

BACKGROUND

Circuits and systems that utilize analog-to-digital converters (ADCs) may increase bandwidth without an appreciable increase in power consumption by using time-interleaved ADCs. A typical time-interleaved ADC circuit includes a plurality of ADC channels each configured to sample an analog input signal to generate a corresponding digital output signal. The digital output signals provided by the ADC channels may be combined to generate a combined output signal having a sampling bandwidth equal to an integer multiple of the sampling bandwidth of the individual ADC channels. For example, a time-interleaved ADC circuit that includes a number N of ADC channels may generate a digital output signal having a sampling bandwidth ($f_{BW}$) equal to N times the sampling bandwidth ($f_s$) of the individual ADC channels (such that $f_{BW}=N*f_s$).

Time-skew mismatches, gain mismatches, frequency offsets, and phase offsets between the individual channels of a time-interleaved ADC circuit may adversely affect performance of the time-interleaved ADC circuit. Calibration circuits may be used to compensate for these mismatches and offsets between the individual ADC channels.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to time-interleaved analog-to-digital converter (ADC) circuits and methods of operation. The time-interleaved ADC circuits disclosed herein may perform background calibration operations to remove offsets associated with chopping circuits and ADCs provided in one or more channels of the ADC circuits. An example time-interleaved ADC circuit may include at least a plurality of channels, a gain calibration circuit, and a time-skew calibration circuit. Each of the plurality of channels may include an ADC, a switch configured to provide a differential input signal to the ADC, a calibration device coupled to an output of the ADC, a multiplier coupled to an output of the calibration device, and a pseudorandom bit sequence (PRBS) circuit to provide a pseudorandom number to the switch, to the calibration device, and to the multiplier. In some embodiments, the pseudorandom numbers generated by the PRBS circuits may be provided to the time-skew calibration circuit. The calibration device within each channel may include selection logic that routes digital signals output from the ADC to either a first offset calibration circuit or a second offset calibration circuit based on the pseudorandom number. The ADC circuit may also include a control circuit configured to adjust clock signals provided to the plurality of channels based, at least in part, on a control signal generated by the time-skew calibration circuit.

In some embodiments, the selection logic may include a de-multiplexer and a multiplexer. The de-multiplexer may include an input coupled to the output of the ADC, a control terminal to receive the pseudorandom number, and first and second outputs. The multiplexer may include first and second inputs, a control terminal to receive the pseudorandom number, and an output coupled to the multiplier. The first offset calibration circuit may be coupled between the first output of the de-multiplexer and the first input of the multiplexer, and the second offset calibration circuit may be coupled between the second output of the de-multiplexer and the second input of the multiplexer. In some aspects, the selection logic may be configured to route digital signals output from the ADC through the first offset calibration circuit based on first values of the pseudorandom number, and to route digital signals output from the ADC through the second offset calibration circuit based on second values of the pseudorandom number. In this manner, the selection logic may alternately allow the first offset calibration circuit to remove offsets from the digital signals (e.g., during first time periods) and allow the second offset calibration circuit to remove offsets from the digital signals (e.g., during second time periods).

The switch within each channel may be any suitable circuit or logic that can scramble the differential input signal based on the pseudorandom number. The switch may be a chopping circuit configured to alternately couple positive and negative components of the differential input signal to inverting and non-inverting input terminals of the ADC based on the pseudorandom number. In some embodiments, the chopping circuit may include a number of "straight" switches that pass the differential input signal to the ADC without polarity inversion, and may include a number of "chopping" switches that pass the differential input signal to the ADC with polarity inversion. In some aspects, the straight switches and the chopping switches may be controlled by the pseudorandom number. In some embodiments, the first offset calibration circuit may be configured to remove offsets associated with the straight switches and to remove offsets of the ADC, and the second offset calibration circuit may be configured to remove offsets associated with the chopping switches and to remove offsets of the ADC.

An example method disclosed herein may be used to calibrate a time-interleaved ADC circuit. The method may include scrambling a differential input signal based on a pseudorandom number; converting the scrambled differential input signal into a digital signal; calibrating the digital signal for offsets using either a first offset calibration circuit or a second offset calibration circuit based on the pseudorandom number; de-scrambling the calibrated digital signal, using a multiplier, based on the pseudorandom number; and removing time-skew offsets from the de-scrambled calibrated digital signal. In some embodiments, removal of the time-skew offsets may be based, at least in part, on the pseudorandom number. The method may also include alternately coupling positive and negative components of the scrambled differential input signal to inverting and non-inverting input terminals of the ADC based on the pseudorandom number.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Aspects of the present disclosure may improve the performance of a time-interleaved ADC circuit by compensating for differences in gain, switching offsets, and time skews between individual ADC channels across an entire frequency spectrum of the time-interleaved ADC circuit. In some implementations, the time-interleaved ADC circuits disclosed herein may also remove flicker noise, offset spurs, and other interference when converting analog signals into digital signals without signal degradation or performance sacrifices, even for input signal components having a frequency equal to a multiple of the sampling frequency of the individual ADC channels. In some aspects, the time-interleaved ADC circuits disclosed herein may utilize the full-rate Nyquist spectrum by removing harmonic noise and offsets associated with chopping circuits and ADCs.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
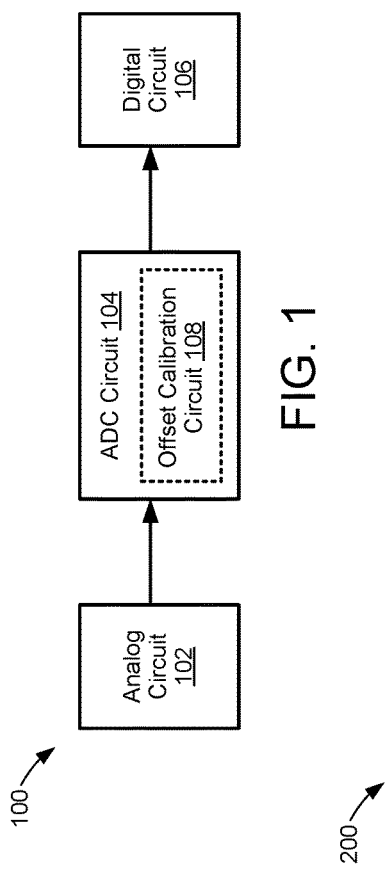
FIG. 1 is a block diagram of an example system within which aspects of the present disclosure may be implemented.

FIG. 1 is a block diagram of an example system 100 within which aspects of the present disclosure may be implemented. The system 100 includes an analog circuit 102, an analog-to-digital converter (ADC) circuit 104, and a digital circuit 106. In other embodiments, the system 100 may include any suitable number of analog circuits 102 and digital circuits 106. The analog circuit 102, which may be any suitable circuit or device that can process analog signals (such as temperature sensors, voltage sensors, current sensors, radio-frequency (RF) circuits, and the like), may process signals, data, or other information to generate one or more analog signals. The ADC circuit 104, which includes inputs coupled to the analog circuit 104 and includes outputs coupled to the digital circuit 106, may convert the analog signals provided by the analog circuit 102 into one or more digital signals as output, for example, by sampling the analog signals using one or more ADCs. The digital circuit 106, which may be any suitable circuit or device that can process digital signals (such as digital signal processors (DSPs), microprocessors, and the like), may process the one or more digital signals provided by the ADC circuit 104. In some embodiments, the ADC circuit 104 and the digital circuit 106 may be configured to monitor, analyze, interpret, or perform some other action or operation on the analog signals output by the analog circuit 102.

For the example of FIG. 1, the ADC circuit 104 may be a time-interleaved ADC circuit that includes a plurality of ADC channels (not shown for simplicity) and an offset calibration circuit 108. The offset calibration circuit 108 may be configured to calibrate one or more of the ADC channels to compensate for a number of offsets between the ADC channels, for example, as described with respect to FIGS. 2 and 3.

Figure 2:
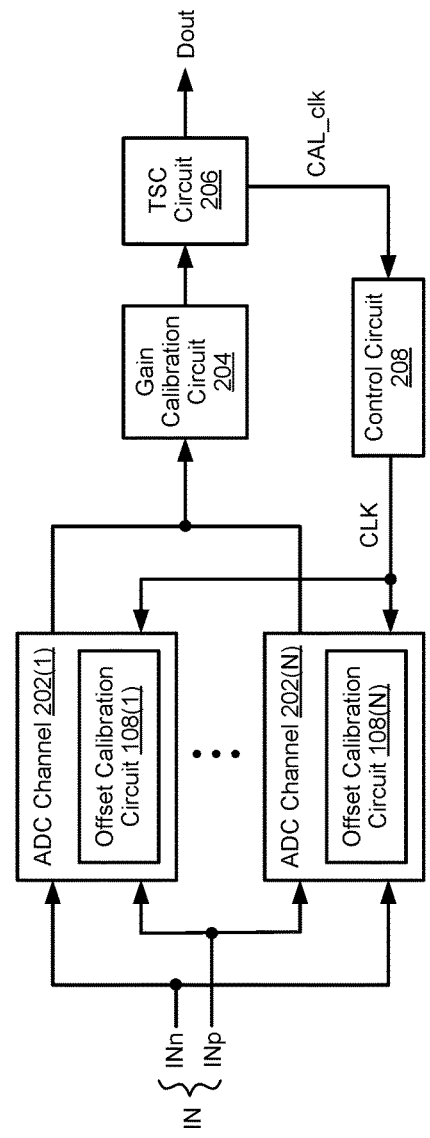
FIG. 2 is a block diagram of an example time-interleaved analog-to-digital converter (ADC) circuit.

FIG. 2 is a block diagram of an example time-interleaved analog-to-digital converter (ADC) circuit 200. The ADC circuit 200, which may receive a differential analog input signal (IN) having a positive component (INp) and a negative component (INn), includes a plurality of ADC channels 202(1)-202(N), a gain calibration circuit 204, a time-skew calibration (TSC) circuit 206, and a control circuit 208. Each of the ADC channels 202(1)-202(N) includes a first input to receive the positive component INp of the input signal, a second input to receive the negative component INn of the input signal, an output coupled to the gain calibration circuit 204, and a control terminal coupled to a corresponding output of the control circuit 208. Each of the ADC channels 202(1)-202(N) may also include a corresponding one of the offset calibration circuits 108(1)-108(N). The gain calibration circuit 204 includes an output coupled to an input of the TSC circuit 206, and may be configured to adjust the output signals provided by the ADC channels 202(1)-202(N) based on a reference value.

The TSC circuit 206 includes a first output to provide a digital output signal (Dout), and includes a second output to provide a clock calibration (CAL_clk) signal to the control circuit 208. In some embodiments, the TSC circuit 206 may adjust the gain-calibrated signals provided by the gain calibration circuit 204 to compensate for time skew between the ADC channels 202(1)-202(N). In addition, or in the alternative, the TSC circuit 206 may embed information indicative of time skews between the ADC channels 202(1)-202(N) into the clock calibration signal (CAL_clk).

In operation, each of the ADC channels 202(1)-202(N) samples the differential analog input signal IN in a time-interleaved manner using one or more clock signals (CLK) provided by the control circuit 208. In some embodiments, each of the ADC channels 202(1)-202(N) may sample the differential analog signal IN at a different phase of a particular clock signal. Each of the offset calibration circuits 108(1)-108(N) may measure or otherwise determine the average of the output signal generated by a corresponding one of the ADC channels 202(1)-202(N), and may remove the determined average from the corresponding output signal. The gain calibration circuit 204 may compensate for gain offsets between the ADC channels 202(1)-202(N), for example, by comparing the root mean square (RMS) power of each of the ADC channel output signals with a reference value and then adjusting the ADC channel output signals based on the comparisons.

The TSC circuit 206 may compensate for time-skew offsets between the ADC channels 202(1)-202(N). In some embodiments, the TSC circuit 206 may be configured to measure the difference (or the delta) between consecutive samples of signals provided by the gain calibration circuit 204, and may generate a clock calibration signal (CAL_clk) indicative of the measured differences. The control circuit 208 may selectively adjust or delay the clock signals provided to the ADC channels 202(1)-202(N) based on the clock calibration signal (CAL_clk) provided by the TSC circuit 206.

Figure 3:
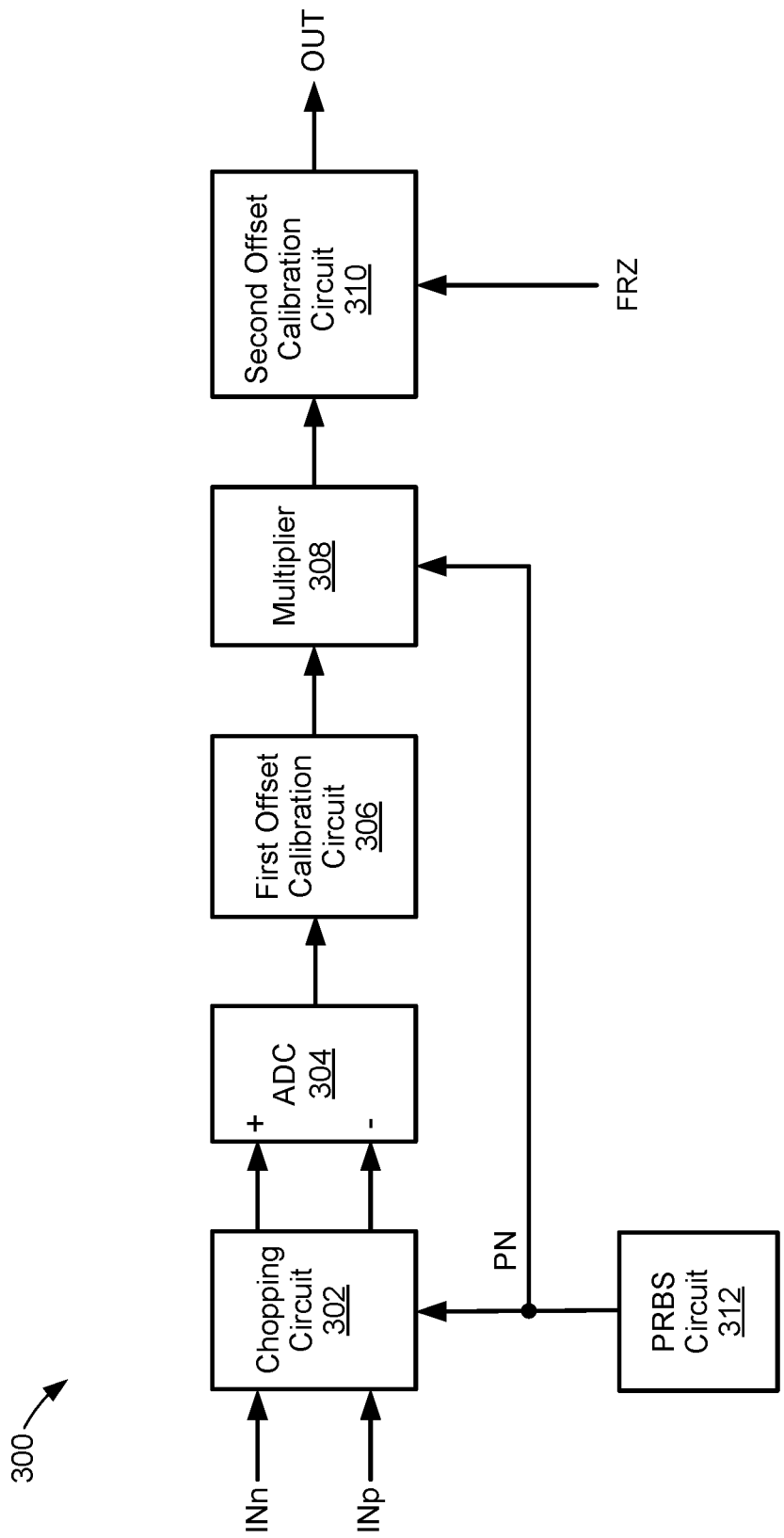
FIG. 3 is a block diagram of an example ADC channel.

FIG. 3 is a block diagram of an example ADC channel 300. The ADC channel 300, which may be an embodiment of one or more of the ADC channels 202(1)-202(N) of FIG. 2, includes a chopping circuit 302, an ADC 304, a first offset calibration circuit 306, a multiplier 308, a second offset calibration circuit 310, and a pseudorandom binary sequence (PRBS) circuit 312. The chopping circuit 302 includes inputs to receive the differential analog input signal IN, and includes outputs coupled to differential inputs of the ADC 304. The chopping circuit 302 may be any suitable switch, coupling circuit, logic, or signal routing circuit that can selectively provide the negative component (INn) of the input signal IN to a non-inverting (+) terminal of the ADC 304 and that can selectively provide the positive component (INp) of the input signal IN to the inverting (−) terminal of the ADC 304. In some embodiments, the chopping circuit 302 may include a number of straight switches and a number of chopping switches (the straight switches and the chopping switches are not shown for simplicity). In this manner, the chopping circuit 302 may dynamically, periodically, or programmably reverse the polarity of analog input signals provided to the ADC 304.

The ADC 304 may be any suitable circuit or device that can convert analog signals into digital signals. In some embodiments, the ADC 304 may be configured to convert differential analog signals into single-ended digital signals, for example, as depicted in FIG. 3. In other embodiments, the ADC 304 may be configured to convert single-ended analog signals into single-ended digital signals. Although not shown for simplicity, the ADC 304 may receive one or more clock signals (such as a sampling clock with which to sample the differential analog input signal).

The first offset calibration circuit 306 includes an input coupled to an output of the ADC 304, and includes an output coupled to an input of the multiplier 308. The second offset calibration circuit 310 includes an input coupled to the output of the multiplier 308, and includes an output to provide an output signal (OUT) for the ADC channel 300. The PRBS circuit 312, which may be any suitable circuit that generates a pseudorandom number or binary sequence, includes an output coupled to a control terminal of the chopping circuit 302 and to a control terminal of the multiplier 308. In some embodiments, the chopping circuit 302 may provide a pseudorandom number (PN) to the chopping circuit 302 and to the multiplier 308.

The chopping circuit 302 may sample the differential analog input signal IN, and may dynamically switch the input signal components INp and INn between the inverting (−) and non-inverting (+) terminals of the ADC 304 based on the pseudorandom number (PN) provided by the PRBS circuit 312. In some implementations, the chopping circuit 302 may use the pseudorandom number (PN) to randomize or scramble the input signal so that flicker noise is spread across the entire frequency spectrum, rather than appearing predominantly at harmonics of the sampling frequency of the ADC channel 300. In addition, or in the alternative, the chopping circuit 302 may prevent components of the analog input signal IN at the sampling frequency of the ADC channel 300 from appearing as noise (e.g., as a DC signal) to the ADC 304.

The first offset calibration circuit 306 may adjust the digital signal generated by the ADC 304 to remove offsets associated with the ADC 304. The multiplier 308 may de-scramble input signal components output from the first offset calibration circuit 306, for example, to preserve components of the input signal at the sampling frequency and/or to reduce flicker noise caused by the chopping circuit 302. The first offset calibration circuit 306 may be unable to remove offsets of the ADC 304 between sampling intervals of the chopping circuit 302. As a result, differential offsets between sampling intervals of multiple instances of the ADC channel 300 may pass through the first offset calibration circuit 306 and the multiplier 308, and appear as time-interleaved residual spurs in the frequency spectrum associated with the time-interleaved ADC circuit 200.

The second offset calibration circuit 310 may process the de-scrambled (or un-chopped) input signal to remove residual differential offsets introduced by the chopping circuit 302. As described, the first offset calibration circuit 306 may be unable to sense the offsets and mismatches associated with the chopping circuit 302, for example, because these offsets and mismatches are scrambled across the frequency spectrum. Because the second offset calibration circuit 310 is downstream from the multiplier 308 (and thus receives a de-scrambled input signal rather than a scrambled input signal), the second offset calibration circuit 310 may sense and compensate for offsets and mismatches associated with the chopping circuit 302.

The second offset calibration circuit 310 may be sensitive to input signal frequencies that are integer multiples of the sampling frequency $f_s$ of the ADC channel 300. To support operation under these strict conditions, an accumulator (not shown for simplicity) within the second offset calibration circuit 310 may be frozen when the differential input signal IN contains signal components that are integer multiples of the sampling frequency $f_s$ of the ADC channel 300. In some embodiments, a freeze signal (FRZ) may be used to selectively freeze or halt operations of the accumulator within the second offset calibration circuit 310. In some aspects, the freeze signal FRZ may be asserted (e.g., to logic high) to freeze or halt operations of the accumulator when the differential input signal IN contains signal components that are integer multiples of the sampling frequency $f_s$, and the freeze signal FRZ may be de-asserted (e.g., to logic low) to allow for normal operation of the accumulator when the differential input signal IN does not contain signal components that are integer multiples of the sampling frequency $f_s$. As a result, the second offset calibration circuit 310 may continue removing residual differential offsets introduced by the chopping circuit 302 even for input signal frequencies at integer multiples of the sampling frequency $f_s$.

In some embodiments, a foreground calibration operation may be used to remove the residual differential offsets for input signal components of any frequency with the bandwidth of the ADC circuit 200. In some aspects, the foreground calibration operation may include the following steps or operations:

- Disable the input signal and let both the first offset calibration circuit 306 and the second offset calibration circuit 310 run continuously. In some aspects, the input signal may be disabled by setting its value to zero.
- After a duration of time, the first offset calibration circuit 306 may operate to remove the total common mode offset from the chopping circuit 302 and the ADC 304, and the second offset calibration circuit 310 may operate to remove the differential offset of the chopping circuit 302.
- Freeze the accumulator (not shown for simplicity) within the second offset calibration circuit 310.
- Enable the input signal.

In accordance with some aspects of the present disclosure, time-interleaved ADC circuits are disclosed that may also remove time-interleaved offset spurs (including flicker noise and offsets associated with chopping circuits). In some embodiments, the time-interleaved ADC circuits disclosed herein may also allow for the acquisition and sampling of input signal components having frequencies equal to integer multiples of each channel's sampling frequency without adversely affecting performance of the offset calibration circuits and without signal corruption. In some embodiments, the time-interleaved ADC circuits disclosed herein may also employ a foreground calibration operation to give full controllability independently of the input signal.

Figure 4:
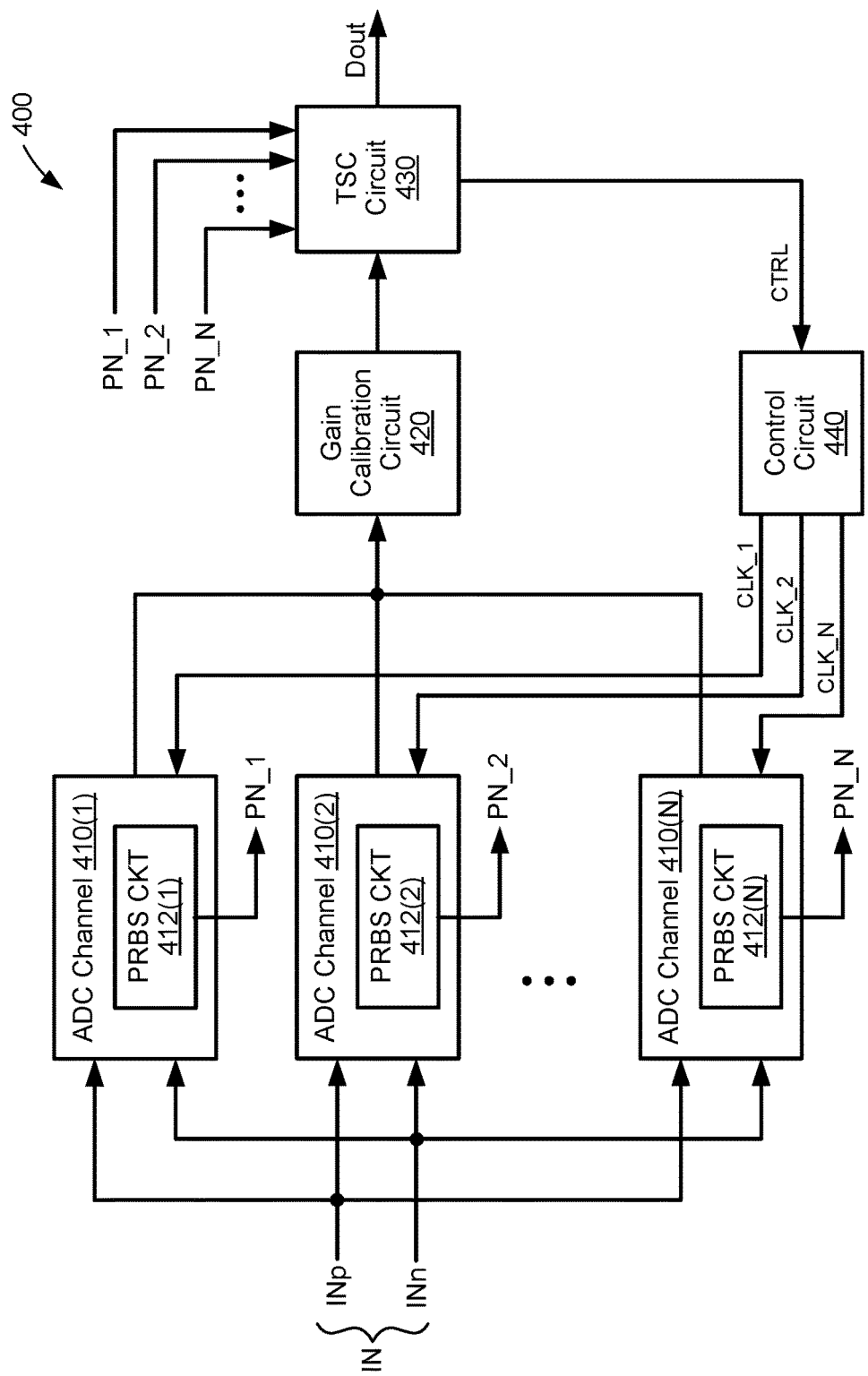
FIG. 4 is a block diagram of an example time-interleaved ADC circuit, in accordance with some embodiments.

FIG. 4 is a block diagram of an example time-interleaved ADC circuit 400, in accordance with some embodiments. The ADC circuit 400 may receive a differential analog input signal (IN) having a positive component (INp) and a negative component (INn), and may generate a digital output signal (Dout) based on the differential analog input signal IN. In some embodiments, the ADC circuit 400 may include a plurality of ADC channels 410(1)-410(N), a gain calibration circuit 420, a time-skew calibration (TSC) circuit 430, and a control circuit 440. Each of the ADC channels 410(1)-410(N) includes a first input to receive the positive component INp of the input signal IN, a second input to receive the negative component INn of the input signal IN, an output coupled to an input of the gain calibration circuit 420, and a clock terminal coupled to a corresponding output of the control circuit 440. Each of the ADC channels 410(1)-410(N) may also include a corresponding one of a plurality of PRBS circuits 412(1)-412(N). The PRBS circuits 412(1)-412(N) may be any suitable circuit or device that can generate a pseudorandom number or binary sequence. In the example embodiment of FIG. 4, the PRBS circuit 412(1) in the first ADC channel 410(1) may generate a first binary number (PN_1), the PRBS circuit 412(2) in the second ADC channel 410(2) may generate a second binary number (PN_2), and so on, and the PRBS circuit 412(N) in the Nth ADC channel 410(N) may generate an Nth binary number (PN_N). In other embodiments, each of the ADC channels 410(1)-410(N) may share a common PRBS circuit 412.

The gain calibration circuit 420 includes an output coupled to an input of the TSC circuit 430, and may be configured to adjust the gain of the output signals provided by the ADC channels 410(1)-410(N) based on a reference value, for example, to compensate for gain offsets between the ADC channels 410(1)-410(N). The TSC circuit 430 includes an input coupled to the output of the gain calibration circuit 420, includes a first output to provide a digital output signal (Dout), and includes a second output to provide a control signal (CTRL). The control signal (CTRL) generated by the TSC circuit 430 may contain information that can be used to compensate for time skew between the ADC channels 410(1)-410(N). In some implementations, the control signal (CTRL) may be used to adjust or delay one or more clock signals (such as clock signals CLK_1-CLK_N) provided to or associated with the ADC channels 410(1)-410(N). In some aspects, the control circuit 440 may adjust the clock signals to calibrate the sampling periods and/or the sampling intervals of one or more of the ADC channels 410(1)-410(N) in a manner that reduces or eliminates time skew, frequency offsets, and/or phase offsets between the ADC channels 410(1)-410(N).

The pseudorandom numbers PN_1 to PN_N generated by respective PRBS circuits 412(1)-412(N) may be used to scramble the differential input signal to spread flicker noise across the frequency spectrum of the ADC circuit 400 prior to conversion to a digital signal, and may be used to de-scramble the calibrated digital signal. In some embodiments, one or more of the pseudorandom numbers PN_1 to PN_N may be used to select one of a group of offset calibration circuits in the corresponding one of the ADC channels 410(1)-410(N) to remove one or more offsets from the analog input signal IN. In some aspects, the pseudorandom numbers PN_1 to PN_N may alternately select different offset calibration circuits to remove one or more offsets from the differential input signal, as described with respect to FIG. 5.

The gain calibration circuit 420 may compensate for gain mismatch between the ADC channels 410(1)-410(N). In some embodiments, the gain calibration circuit 420 may compensate for gain mismatch between the ADC channels 410(1)-410(N) by comparing the root mean square (RMS) power of each of the ADC channel output signals with a reference value and adjusting the ADC channel output signals based on the comparisons. In other embodiments, the gain calibration circuit 420 may compensate for gain mismatch between the ADC channels 410(1)-410(N) using other suitable techniques.

The TSC circuit 430 may compensate for time skew between the ADC channels 410(1)-410(N). In some embodiments, the TSC circuit 430 may be configured to measure the difference (or the delta) between consecutive samples output by the gain calibration circuit 420 and to generate a control signal (CTRL) indicative of the measured differences. In other embodiments, the TSC circuit 430 may generate the control signal (CTRL) using other suitable techniques. For the example embodiment of FIG. 4, the TSC circuit 430 is shown to include inputs coupled to receive the pseudorandom numbers PN_1 to PN_N generated by respective PRBS circuits 412(1)-412(N). In some embodiments, the TSC circuit 430 may use the pseudorandom numbers PN_1 to PN_N to ensure accurate time-skew compensation of digital signals output from the ADC channels 410(1)-410(N). In other embodiments, the TSC circuit 430 may use any other suitable pseudorandom numbers or signals to ensure accurate time-skew compensation.

The control circuit 440 may include an input to receive the control signal (CTRL) generated by the TSC circuit 430, and may include a number of outputs coupled to the ADC channels 410(1)-410(N). In some embodiments, the control circuit 440 may selectively adjust or delay the clock signals CLK_1-CLK_N provided to respective ADC channels 410(1)-410(N) based on the control signal (CTRL) provided by the TSC circuit 430, for example, to compensate for time skews, frequency offsets, and/or phase offsets between the ADC channels 410(1)-410(N).

Figure 5:
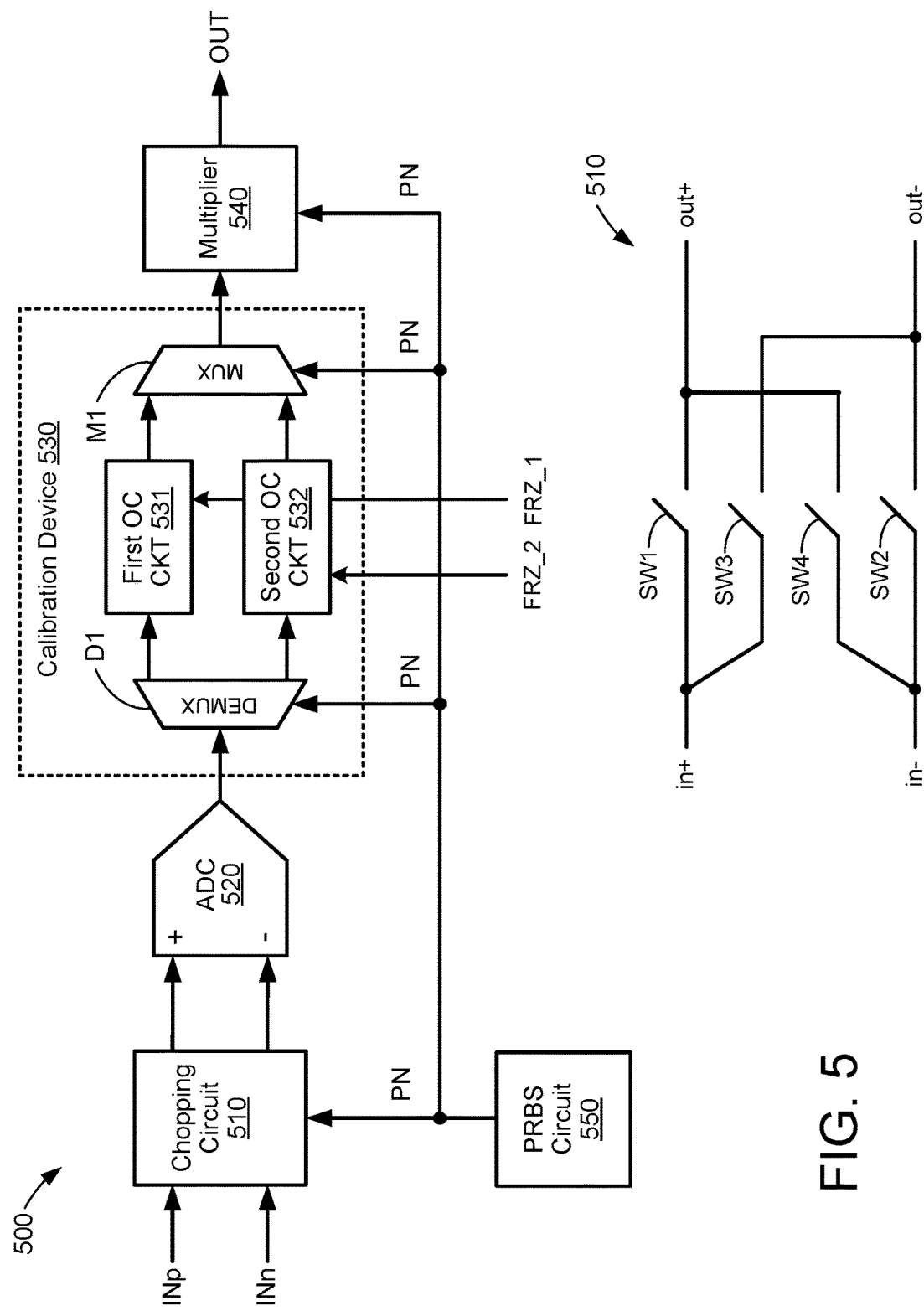
FIG. 5 is a block diagram of an example ADC channel, in accordance with some embodiments.

FIG. 5 is a block diagram of an example ADC channel 500, in accordance with some embodiments. The ADC channel 500, which may be an embodiment of one or more of the ADC channels 410(1)-410(N) of FIG. 4, includes a chopping circuit 510, an ADC 520, a calibration device 530, a multiplier 540, and a PRBS circuit 550. The chopping circuit 510, which may be one implementation of the chopping circuit 302 of FIG. 3, includes inputs to receive the differential input signal IN, and includes outputs coupled to differential inputs of the ADC 520. The chopping circuit 510 may be any suitable switch, coupling circuit, logic, or cross-over matrix that can alternately couple the positive components (INp) and the negative components (INn) of the differential input signal IN to the non-inverting (+) and inverting (−) terminals of the ADC 520 based on the pseudorandom number PN such that, for example, the ADC 520 may alternately sample the positive components (INp) and the negative components (INn) of the differential input signal IN. In this manner, the chopping circuit 510 may ensure that digital signals generated by the ADC 520 are randomized.

In some embodiments, the chopping circuit 510 may include a number of switches that alternately couple the positive and negative signal components of the differential input signal to the non-inverting and inverting terminals of the ADC 520 in a manner that scrambles or randomizes the differential input signal. For example, FIG. 5 shows one embodiment of the chopping circuit 510 depicted as including four switches SW1-SW4 coupled between a pair of positive and negative input terminals (in+ and in−) and a pair of positive and negative output terminals (out+ and out−). The switch SW1 is coupled between the positive input terminal (in+) and the positive output terminal (out+) of the chopping circuit 510, the switch SW2 is coupled between the negative input terminal (in−) and the negative output terminal (out−) of the chopping circuit 510, the switch SW3 is coupled between the positive input terminal (in+) and the negative output terminal (out−) of the chopping circuit 510, and the switch SW4 is coupled between the negative input terminal (in−) and the positive output terminal (out+) of the chopping circuit 510.

When the pseudorandom number PN is one of a number of first values, the chopping circuit 510 may be in a first state in which the switches SW1-SW2 are closed (such as in conductive states) and the switches SW3-SW4 are open (such as in non-conductive states). In this first state, the chopping circuit 510 routes the positive components of the differential input signal IN to the non-inverting terminal (+) of the ADC 520 via the switch SW1, and routes the negative components of the differential input signal IN to the inverting terminal (−) of the ADC 520 via the switch SW2. In this manner, the chopping circuit 510 may pass the differential input signal "straight" through (such as without polarity inversion) to the ADC 520. As such, the switches SW1-SW2 may be referred to herein as the "straight" switches of the chopping circuit 510.

When the pseudorandom number PN is one of a number of second values, the chopping circuit 510 may be in a second state in which the switches SW1-SW2 are open (such as in non-conductive states) and the switches SW3-SW4 are closed (such as in conductive states). In this second state, the chopping circuit 510 routes the positive components of the differential input signal IN to the inverting terminal (−) of the ADC 520 via the switch SW3, and routes the negative components of the differential input signal IN to the non-inverting terminal (+) of the ADC 520 via the switch SW4. In this manner, the chopping circuit 510 may chop (such as with polarity inversion) the differential input signal provided to the ADC 520. As such, the switches SW3-SW4 may be referred to herein as the "chopping" switches of the chopping circuit 510.

The ADC 520 may be any suitable circuit or device that can convert analog signals into digital signals. In some embodiments, the ADC 520 may be configured to convert differential analog signals into single-ended digital signals, for example, as depicted in the example of FIG. 5. In other embodiments, the ADC 520 may be configured to convert single-ended analog signals into single-ended digital signals.

The calibration device 530 is coupled between the ADC 520 and the multiplier 540, and includes a de-multiplexer (DEMUX) D1, a first offset calibration circuit 531, a second offset calibration circuit 532, and a multiplexer (MUX) M1. The de-multiplexer D1 includes an input coupled to the output of the ADC 520, includes a first output coupled to an input of the first OC circuit 531, includes a second output coupled to an input of the second OC circuit 532, and includes a control terminal coupled to the output of the PRBS circuit 550. The multiplexer M1 includes a first input coupled to an output of the first OC circuit 531, includes a second input coupled to an output of the second OC circuit 532, includes an output coupled to an input of the multiplier 540, and includes a control terminal coupled to the output of the PRBS circuit 550.

The first and second offset calibration circuits 531 and 532 are coupled in parallel with each other between the de-multiplexer D1 and the multiplexer M1. The first offset calibration circuit 531 may be configured to remove, from digital signals output by the ADC 520, offsets caused by or associated with one or more straight switches in the chopping circuit 510 (and/or offsets caused by or associated with other circuit elements within the chopping circuit 510 that maintain the polarity of the differential input signal IN when routing to the ADC 520). The first offset calibration circuit 531 may also be configured to remove offsets caused by or associated with the ADC 520. The second offset calibration circuit 532 may be configured to remove, from digital signals output by the ADC 520, offsets caused by or associated with one or more chopping switches in the chopping circuit 510 (and/or offsets caused by or associated with other circuit elements within the chopping circuit 510 that reverse the polarity of the differential input signal IN when routing to the ADC 520). The second offset calibration circuit 532 may also be configured to remove offsets caused by or associated with the ADC 520. It is noted that while the ADC channel 300 described with respect to FIG. 3 includes two offset calibration circuits 306 and 310 coupled in series with each other, the ADC channel 500 described with respect to FIG. 5 includes first and second offset calibration circuits 531 and 531 coupled in parallel with each other.

In some embodiments, one or more freeze signals may be used to selectively freeze or halt operations of accumulators (not shown for simplicity) provided within the first and second offset calibration circuits 531 and 532. For the example embodiment shown in FIG. 5, the first offset calibration circuit 531 may include an input to receive a first freeze signal (FRZ_1), and the second offset calibration circuit 532 may include an input to receive a second freeze signal (FRZ_2). In some aspects, the first freeze signal FRZ_1 may be asserted (e.g., to logic high) to freeze or halt operations of the accumulator within the first offset calibration circuit 531 when the differential input signal IN contains signal components that are integer multiples of the sampling frequency $f_s$ of the ADC channel 500, and the second freeze signal FRZ_2 may be asserted (e.g., to logic high) to freeze or halt operations of the accumulator within the second offset calibration circuit 532 when the differential input signal IN contains signal components that are integer multiples of the sampling frequency $f_s$ of the ADC channel 500. The first and second freeze signals FRZ_1 and FRZ_2 may be de-asserted (e.g., to logic low) to allow for normal operation of the accumulators within the first and second offset calibration circuits 531 and 532, respectively, when the differential input signal IN does not contain signal components that are integer multiples of the sampling frequency $f_s$. In this manner, the ADC channel 500 may operate in a normal manner even when frequency components of the differential input signal IN are equal to integer multiples of the sampling frequency $f_s$ of the ADC channel 500. In other embodiments, the first and second offset calibration circuits 531 and 532 may receive the same freeze signal.

The multiplier 540 includes an output to provide the digital output signal Dout, and includes a control terminal coupled to the output of the PRBS circuit 550. In some embodiments, the multiplier 540 may de-scramble the calibrated digital signal output from the calibration device 530, for example, to reduce flicker noise caused by the chopping circuit 510.

The PRBS circuit 550, which may be an embodiment of one or more of the PRBS circuits 412(1)-412(N) of FIG. 4, may provide a pseudorandom number (PN) to the chopping circuit 510, to the de-multiplexer D1, to the multiplexer M1, and to the multiplier 540. In some embodiments, the PRBS circuit 550 may also provide the pseudorandom number (PN) to the TSC circuit 430 of FIG. 4.

The chopping circuit 510 may sample the differential input signal, and may alternately switch the positive signal components INp and the negative signal components INn of the differential input signal IN between the non-inverting (+) and the inverting (−) terminals of the ADC 520 based on the pseudorandom number (PN). In some embodiments, chopping circuit 510 may sample the differential input signal, and may alternately switch the positive signal components INp and the negative signal components INn of the differential input signal IN between the non-inverting (+) and the inverting (−) terminals of the ADC 520 based on the pseudorandom number (PN). In this manner, the chopping circuit 510 may ensure that digital signals generated by the ADC 520 are randomized.

When the first offset calibration circuit 531 is selected by the selection logic formed by the de-multiplexer D1 and the multiplexer M1 in response to the pseudorandom number (PN), the first offset calibration circuit 531 may adjust the digital signal generated by the ADC 520 to remove offsets associated with the ADC 520 and to remove offsets associated with straight switches provided within the chopping circuit 510. When the second offset calibration circuit 532 is selected by the selection logic formed by the de-multiplexer D1 and the multiplexer M1 in response to the pseudorandom number (PN), the second offset calibration circuit 532 may adjust the digital signal generated by the ADC 520 to remove offsets associated with the ADC 520 and to remove offsets associated with chopping switches provided within the chopping circuit 510. The multiplier 540 may "un-chop" the adjusted digital signal provided by either the first offset calibration circuit 531 or the second offset calibration circuit 532 based on the pseudorandom number (PN), for example to reduce flicker noise caused by the ADC 520. It is noted that if the frequency response of the first offset calibration circuit 531 is less than a value, the first offset calibration circuit 531 is not able to follow the flicker noise caused by the ADC 520, which allows the flicker noise to scramble across the frequency bandwidth of the ADC channel 500 (rather than appearing at multiples of the sampling frequency of the ADC channel 500).

Figure 6:
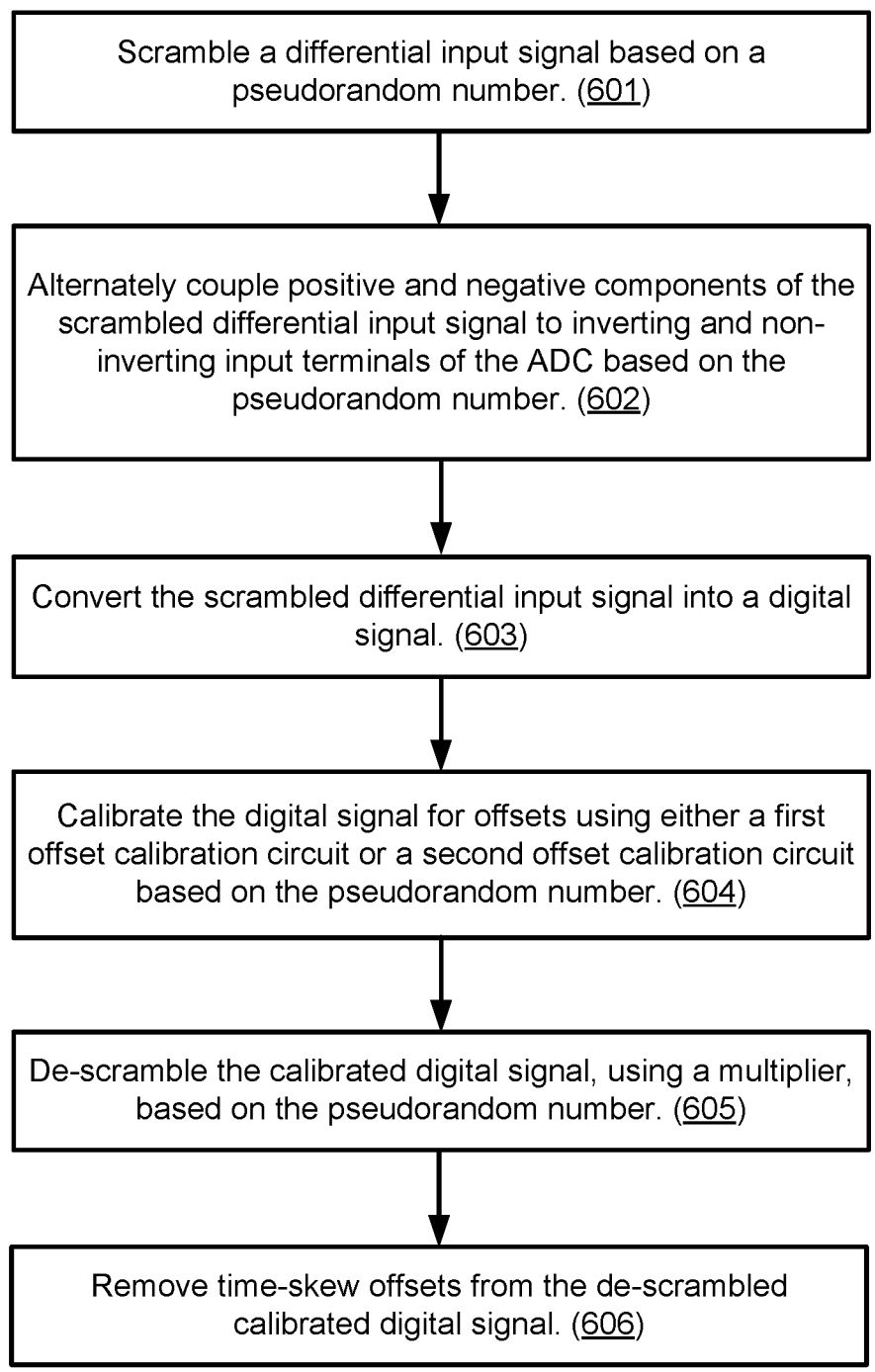
FIG. 6 is an illustrative flow chart depicting an example operation for operating a time-interleaved ADC circuit, in accordance with some embodiments.

FIG. 6 is an illustrative flow chart depicting an example operation 600 for operating a time-interleaved ADC circuit, in accordance with some embodiments. Although described herein with respect to the ADC circuit 400 of FIGS. 4-5, the example operation 600 may be performed by any other suitable ADC circuit. In some embodiments, the operation 600 may be performed as a foreground calibration operation.

The ADC circuit 400 may scramble a differential input signal based on a pseudorandom number (601). In some embodiments, the chopping circuit 510 may use the pseudorandom number provided by the PRBS circuit 550 to scramble the differential input signal so that flicker noise is spread across the entire frequency spectrum of the ADC circuit 400, rather than appearing predominantly at harmonics of the sampling frequency of the ADC channels 410(1)-410(N).

The ADC circuit 400 may alternately couple positive and negative components of the scrambled differential input signal to inverting and non-inverting input terminals of the ADC based on the pseudorandom number (602). In some embodiments, the chopping circuit 510 may prevent components of the differential input signal at the sampling frequency of the ADC channels 410(1)-410(N) from appearing as noise (e.g., as a DC signal) to the ADCs.

The ADC circuit 400 may convert the scrambled differential input signal into a digital signal (603). In some embodiments, the ADC 520 may be configured to convert differential analog signals into single-ended digital signals, for example, as depicted in the example of FIG. 5. In other embodiments, the ADC 520 may be configured to convert single-ended analog signals into single-ended digital signals.

The ADC circuit 400 may calibrate the digital signal for offsets using either a first offset calibration circuit or a second offset calibration circuit based on the pseudorandom number (604). Referring also to FIG. 5, the first and second offset calibration circuits 531 and 532 may be coupled in parallel with each other between the de-multiplexer D1 and the multiplexer M1. The first offset calibration circuit 531 may remove offsets of the ADC from digital signals output by the ADC 520 and may remove offsets from straight switches from the differential input signal. The second offset calibration circuit 532 may remove offsets of the ADC 520 from digital signals output by the ADC 520 and may remove offsets from chopping circuit 510. In some embodiments, a selection circuit formed by the de-multiplexer D1 and the multiplexer M1 may route digital signals output from the ADC 520 through the first offset calibration circuit 531A based on first values of the pseudorandom number, and may route digital signals output from the ADC 520 through the second offset calibration circuit 531B based on second values of the pseudorandom number.

The ADC circuit 400 may de-scramble the calibrated digital signal, using a multiplier, based on the pseudorandom number (605). In some embodiments, the multiplier 540 may de-scramble the calibrated digital signal output from the calibration device 530, for example, to reduce flicker noise caused by the chopping circuit 510.

The ADC circuit 400 may remove time-skew offsets from the de-scrambled calibrated digital signal (606). In some embodiments, the TSC circuit 430 may generate control signals that can be used to compensate for time skew between the ADC channels 410(1)-410(N). In some aspects, the control signals may be used to adjust or delay one or more clock signals provided to or associated with the ADC channels 410(1)-410(N), for example, to calibrate the sampling periods and/or the sampling intervals of one or more of the ADC channels 410(1)-410(N) in a manner that reduces or eliminates time skew, frequency offsets, and/or phase offsets between the ADC channels 410(1)-410(N).

Figure 7:
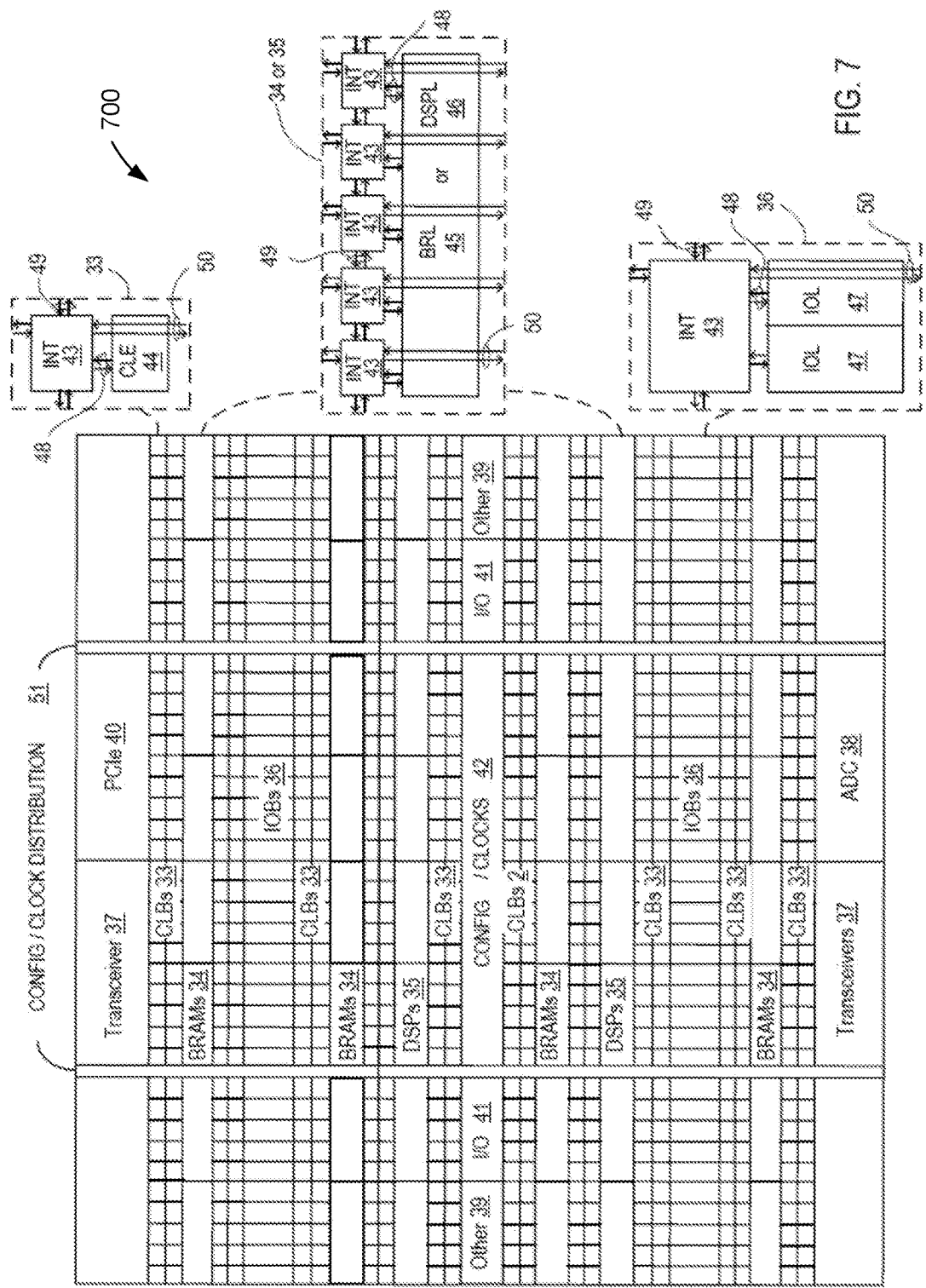
FIG. 7 illustrates an architecture of an example field programmable gate array (FPGA) within which aspects of the present disclosure may be implemented.

FIG. 7 illustrates an architecture 700 of a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 7. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 7) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus for analog-to-digital conversion, comprising:
    a plurality of channels each including:
        an analog-to-digital converter (ADC);
        a switch configured to provide a differential input signal to the ADC;
        a calibration device coupled to an output of the ADC;
        a multiplier coupled to an output of the calibration device; and a pseudorandom bit sequence (PRBS) circuit configured to provide a pseudorandom number to the switch, to the calibration device, and to the multiplier;

a gain calibration circuit including inputs coupled to the calibration device in each of the plurality of channels; and a time-skew calibration circuit coupled to the gain calibration circuit, and configured to provide an output signal based, at least in part, on the differential input signal and the pseudorandom number.

2. The apparatus of claim 1, wherein the switch comprises a chopping circuit configured to scramble the differential input signal based on the pseudorandom number.

3. The apparatus of claim 1, wherein the switch is configured to alternately couple positive and negative components of the differential input signal to inverting and non-inverting inputs of the ADC based on the pseudorandom number.

4. The apparatus of claim 1, wherein the calibration device comprises:
   a de-multiplexer including an input coupled to the output of the ADC, a control terminal to receive the pseudorandom number, and a number of outputs;
   a multiplexer including a number of inputs, a control terminal to receive the pseudorandom number, and an output coupled to the multiplier; and
   first and second offset calibration circuits coupled in parallel with each other between the number of outputs of the de-multiplexer and the number of inputs of the multiplexer.

5. The apparatus of claim 4, wherein the de-multiplexer and the multiplexer are configured to:
   route digital signals output from the ADC through the first offset calibration circuit based on first values of the pseudorandom number; and
   route digital signals output from the ADC through the second offset calibration circuit based on second values of the pseudorandom number.

6. The apparatus of claim 4, wherein the switch comprises a chopping circuit including a number of straight switches and a number of chopping switches, wherein:
   the first offset calibration circuit is configured to remove offsets associated with the straight switches and to remove offsets of the ADC; and
   the second offset calibration circuit is configured to remove offsets associated with the chopping switches and to remove offsets of the ADC.

7. The apparatus of claim 1, wherein the time-skew calibration circuit is coupled to the gain calibration circuit and to the PRBS circuit in each of the plurality of channels.

8. The apparatus of claim 1, further comprising:
   a control circuit configured to adjust clock signals provided to the plurality of channels based, at least in part, on a control signal generated by the time-skew calibration circuit.

9. An integrated circuit, comprising:
   an analog circuit configured to generate a differential input signal; and
   an analog-to-digital converter (ADC) circuit including a plurality of channels, each comprising:
      an ADC including an inverting input terminal, a non-inverting input terminal, and one or more outputs;
      a pseudorandom bit sequence (PRBS) circuit configured to generate a pseudorandom number;
      a chopping circuit configured to alternately couple positive and negative components of the differential input signal between the inverting and non-inverting input terminals of the ADC based on the pseudorandom number;
      a calibration device coupled to the one or more outputs of the ADC and responsive to the pseudorandom number; and
      a multiplier coupled to the calibration device and responsive to the pseudorandom number.

10. The integrated circuit of claim 9, wherein the chopping circuit is configured to scramble the differential input signal based on the pseudorandom number.

11. The integrated circuit of claim 9, further comprising:
    a gain calibration circuit coupled to an output of the calibration device in each of the plurality of channels; and
    a time-skew calibration circuit, coupled to the gain calibration circuit, and including an output to provide a digital output signal indicative of the differential input signal.

12. The integrated circuit of claim 11, wherein the time-skew calibration circuit further includes inputs coupled to the PRBS circuit in each of the plurality of channels.

13. The integrated circuit of claim 11, further comprising:
    a control circuit configured to adjust clock signals provided to the plurality of channels based, at least in part, on a control signal generated by the time-skew calibration circuit.

14. The integrated circuit of claim 11, wherein the calibration device comprises:
    a de-multiplexer including an input coupled to the one or more outputs of the ADC, a control terminal to receive the pseudorandom number, and first and second outputs;
    a multiplexer including first and second inputs, a control terminal to receive the pseudorandom number, and an output coupled to the multiplier;
    a first offset calibration circuit coupled between the first output of the de-multiplexer and the first input of the multiplexer; and
    a second offset calibration circuit coupled between the second output of the de-multiplexer and the second input of the multiplexer, wherein the first and second offset calibration circuits are coupled in parallel with each other.

15. The integrated circuit of claim 14, wherein the de-multiplexer and the multiplexer are configured to:
    route digital signals output from the ADC through the first offset calibration circuit based on first values of the pseudorandom number; and
    route digital signals output from the ADC through the second offset calibration circuit based on second values of the pseudorandom number.

16. The integrated circuit of claim 14, wherein the chopping circuit comprises a number of straight switches and a number of chopping switches, and wherein:
    the first offset calibration circuit is configured to remove offsets associated with the straight switches from the differential input signal and to remove offsets of the ADC from digital signals provided to the calibration device; and
    the second offset calibration circuit is configured to remove offsets associated with the chopping switches from the differential input signal and to remove offsets of the ADC from digital signals provided to the calibration device.

17. A method of calibrating an analog-to-digital converter (ADC) circuit, comprising:

scrambling a differential input signal, using a chopping circuit, based on a pseudorandom number;

converting the scrambled differential input signal into a digital signal using an ADC;

calibrating the digital signal for offsets using either a first offset calibration circuit or a second offset calibration circuit based on the pseudorandom number;

de-scrambling the calibrated digital signal, using a multiplier, based on the pseudorandom number; and removing time-skew offsets from the de-scrambled calibrated digital signal.

18. The method of claim 17, wherein removing the time-skew offsets is based, at least in part, on the pseudorandom number.

19. The method of claim 17, further comprising:

alternately coupling positive and negative components of the scrambled differential input signal to inverting and non-inverting input terminals of the ADC based on the pseudorandom number.

20. The method of claim 17, wherein the chopping circuit comprises a number of straight switches and a number of chopping switches, and wherein:

the first offset calibration circuit is configured to remove offsets associated with the straight switches from the differential input signal and to remove offsets of the ADC; and the second offset calibration circuit is configured to remove offsets associated with the chopping switches from the differential input signal and to remove offsets of the ADC.

* * * * *